(12) United States Patent
Hong et al.

(10) Patent No.: US 12,406,903 B2
(45) Date of Patent: Sep. 2, 2025

(54) SEMICONDUCTOR DEVICE WITH TWO-PHASE COOLING STRUCTURE

(71) Applicant: SAMSUNG ELECTRONICS CO., LTD., Suwon-si (KR)

(72) Inventors: Seogwoo Hong, Suwon-si (KR); Sungchan Kang, Suwon-si (KR); Daehyuk Son, Suwon-si (KR); Jeongyub Lee, Suwon-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 199 days.

(21) Appl. No.: 18/206,472

(22) Filed: Jun. 6, 2023

(65) Prior Publication Data
US 2024/0203825 A1   Jun. 20, 2024

(30) Foreign Application Priority Data
Dec. 20, 2022  (KR) .................. 10-2022-0179735

(51) Int. Cl.
H01L 23/473   (2006.01)
H01L 23/00    (2006.01)
H01L 25/065   (2023.01)

(52) U.S. Cl.
CPC ............ H01L 23/473 (2013.01); H01L 24/16 (2013.01); H01L 25/0655 (2013.01);
(Continued)

(58) Field of Classification Search
CPC .... H01L 23/473; H01L 24/16; H01L 25/0655
See application file for complete search history.

(56) References Cited

U.S. PATENT DOCUMENTS

| | | | | |
|---|---|---|---|---|
| 6,070,656 A | * | 6/2000 | Dickey | H01L 23/473 |
| | | | | 257/E23.098 |
| 7,180,179 B2 | * | 2/2007 | Mok | H01L 23/427 |
| | | | | 257/714 |

(Continued)

FOREIGN PATENT DOCUMENTS

| | | | | |
|---|---|---|---|---|
| DE | 102009049550 A1 | * | 5/2011 | ............. F24J 2/4623 |
| JP | 2013-2735 A | | 1/2013 | |
| WO | 2019/165558 A1 | | 9/2019 | |

OTHER PUBLICATIONS

DE 102009049550 A1 English translation (Year: 2011).*
Zhang et al., "A review of the state-of-the art in electronic cooling", Advances in Electrical Engineering, Electronics and Energy, Oct. 2021, vol. 1, No. 100009 (26 pages total).
"Film Boiling", https://www.nuclear-power.com/nuclear-engineering/heat-transfer/boiling-and-condensation/boiling-boiling-characteristics/film-boiling/.

(Continued)

Primary Examiner — Mukundbhai G Patel
(74) Attorney, Agent, or Firm — Sughrue Mion, PLLC

(57) ABSTRACT

A semiconductor device includes a semiconductor chip including a semiconductor integrated circuit; a cooling channel including a surface of the semiconductor chip and configured to provide a passage for a coolant to cool the semiconductor chip; and a plurality of flexible capillary patterns on the surface of the semiconductor chip inside the cooling channel and configured to move the coolant by capillary action, wherein each capillary pattern of the plurality of flexible capillary patterns may include a first portion in a length direction of the capillary pattern that contacts and is supported by the surface of the semiconductor chip, and a second portion in the length direction that is spaced apart from and unsupported by the surface of the semiconductor chip, and a curvature of the second portion of each capillary pattern of the plurality of flexible capillary patterns changes according to temperature.

19 Claims, 14 Drawing Sheets

(52) U.S. Cl.
CPC ............ *H01L 2224/16221* (2013.01); *H01L 2924/16151* (2013.01); *H01L 2924/16152* (2013.01)

(56) References Cited

U.S. PATENT DOCUMENTS

| | | |
|---|---|---|
| 9,169,567 B2 | 10/2015 | Hefner et al. |
| 2006/0131737 A1 | 6/2006 | Im et al. |
| 2011/0205708 A1 | 8/2011 | Andry et al. |
| 2015/0198380 A1* | 7/2015 | Haj-Hariri ............ F28D 15/02 62/3.2 |
| 2017/0211897 A1 | 7/2017 | Agee et al. |
| 2020/0105644 A1 | 4/2020 | Teng et al. |
| 2021/0098335 A1 | 4/2021 | Yu et al. |
| 2024/0203821 A1 | 6/2024 | Kang et al. |

OTHER PUBLICATIONS

Wang et al., "Review of aerospace-oriented spray cooling technology", , Progress in Aerospace Sciences, Jul. 2020, vol. 116, No. 100635, pp. 1-14 (14 pages total).

Wu et al. ,"Thermal modeling and comparative analysis of jet impingement liquid cooling for high power electronics", International Journal of Heat and Mass Transfer, Jul. 2019, vol. 137, pp. 42-51 (10 pages total).

Lee et al., "High-Efficiency Two-Phase Flow Cooling Technology for Electronic Component Cooling", Korea Institute of Science and Technology Information, pp. 1-7 (10 pages total).

Huang et al., "Advanced System Integration for High Performance Computing with Liquid Cooling", 2021 IEEE 71st Electronic Components and Technology Conference (ECTC), Jun. 1, 2021, pp. 105-111 (7 pages total).

Wu et al., "Ultra High Power Cooling Solution for 3D-ICs", 2021 Symposium on VLSI Circuits, Jun. 13, 2021, pp. 1-2 (2 pages total).

* cited by examiner

SEMICONDUCTOR DEVICE WITH TWO-PHASE COOLING STRUCTURE

CROSS-REFERENCE TO RELATED APPLICATION

This application is based on and claims priority under 35 U.S.C. § 119 to Korean Patent Application No. 10-2022-0179735, filed on Dec. 20, 2022, in the Korean Intellectual Property Office, the disclosure of which is incorporated by reference herein in its entirety.

BACKGROUND

1. Field

The disclosure relates to a semiconductor device with a cooling structure.

2. Description of Related Art

In order to remove heat generated from electronic devices, an air-cooling device has been mainly used. As the power density of electronic devices gradually increases, the use of cooling devices is increasing to cope with the increased heat generation. Moreover, in the case of a data center, in order to reduce the amount of power used, interest in a next-generation cooling method with high efficiency, such as a liquid cooling device, is gradually increasing. Depending on a temperature range of a part where heat is generated, the cooling method includes a single-phase liquid cooling method without a phase change of a coolant and a two-phase liquid cooling method involving a phase change of a coolant. The two-phase cooling method has a higher calorific value range than the single-phase cooling method.

SUMMARY

Provided is a semiconductor device employing a two-phase liquid cooling method.

Provided is a semiconductor device employing a two-phase liquid cooling method capable of effectively supplying a liquid coolant to a heat transfer surface.

Provided is a semiconductor device employing a two-phase liquid cooling method capable of coping with a decrease in cooling efficiency due to vapor adsorption to a heat transfer surface.

Additional aspects will be set forth in part in the description which follows and, in part, will be apparent from the description, or may be learned by practice of embodiments of the disclosure.

According to an aspect of an example embodiment, a semiconductor device includes: a semiconductor chip including a semiconductor integrated circuit; a cooling channel including a surface of the semiconductor chip and configured to provide a passage for a coolant to cool the semiconductor chip; and a plurality of flexible capillary patterns on the surface of the semiconductor chip inside the cooling channel and configured to move the coolant by capillary action, wherein each capillary pattern of the plurality of flexible capillary patterns may include a first portion in a length direction of the capillary pattern that contacts and is supported by the surface of the semiconductor chip, and a second portion in the length direction that is spaced apart from and unsupported by the surface of the semiconductor chip, and a curvature of the second portion of each capillary pattern of the plurality of flexible capillary patterns changes according to temperature.

Each capillary pattern of the plurality of flexible capillary patterns further may include a first layer having a first thermal expansion coefficient and a second layer having a second thermal expansion coefficient that is different from the first thermal expansion coefficient.

The second portion of each capillary pattern of the plurality of flexible capillary patterns may have a roll shape.

The surface of the semiconductor chip on which the plurality of flexible capillary patterns are formed may be an upper surface of the semiconductor chip.

Each capillary pattern of the plurality of flexible capillary patterns may include a first layer having a first thermal expansion coefficient and a second layer having a second thermal expansion coefficient that is less than the first thermal expansion coefficient, and the first layer may be adjacent to the surface of the semiconductor chip, and the second layer may be disposed on the first layer.

Each capillary pattern of the plurality of flexible capillary patterns may include a plurality of curved portions that are convex in a direction opposite to the surface of the semiconductor chip.

Each curved portion of the plurality of curved portions extends in a width direction of the capillary pattern that is perpendicular to the length direction.

Each capillary pattern of the plurality of flexible capillary patterns may include a plurality of protrusions configured to prevent adhesion with the surface of the semiconductor chip.

The plurality of protrusions may be on a surface of the capillary pattern facing the surface of the semiconductor chip.

Each capillary pattern of the plurality of flexible capillary patterns may include a surface roughness structure on a surface of the capillary pattern facing to the surface of the semiconductor chip.

The cooling channel may include an immersed unit immersed from an upper surface of the semiconductor chip, the upper surface of the semiconductor chip may include a bottom of the immersed unit, and the capillary pattern may be on the bottom of the immersed unit.

The semiconductor device may further include a housing surrounding the semiconductor chip, and the cooling channel may be in a space between the semiconductor chip and the housing.

According to an aspect of an example embodiment, a semiconductor device includes: a semiconductor chip including a semiconductor integrated circuit; a cooling channel including a surface of the semiconductor chip and configured to provide a passage for a coolant to cool the semiconductor chip; and a flexible capillary pattern formed on the surface of the semiconductor chip to move the coolant by capillary action, wherein at least a portion of the flexible capillary pattern has a roll shape, and the flexible capillary pattern may include a first layer having a first thermal expansion coefficient and a second layer having a second thermal expansion coefficient that different from the first thermal expansion coefficient.

A curvature of the flexible capillary pattern may change with temperature.

The flexible capillary pattern may include an anti-distortion unit configured to prevent distortion of the flexible capillary pattern in a width direction of the flexible capillary pattern.

The anti-distortion unit may include a plurality of curved portions that are convex in a direction opposite to the surface of the semiconductor chip, and extend in a width direction of the flexible capillary pattern.

The semiconductor may further include a plurality of protrusions formed on a surface of the flexible capillary pattern facing the surface of the semiconductor chip.

The flexible capillary pattern may include a surface roughness structure formed on a surface of the flexible capillary pattern facing the surface of the semiconductor chip.

The cooling channel may include an immersed unit immersed from an upper surface of the semiconductor chip, the upper surface of the semiconductor chip may include a bottom of the immersed unit, and the flexible capillary pattern may be on the bottom of the immersed unit.

The semiconductor device may further include a housing surrounding the semiconductor chip, and the cooling channel may be in a space between the semiconductor chip and the housing.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
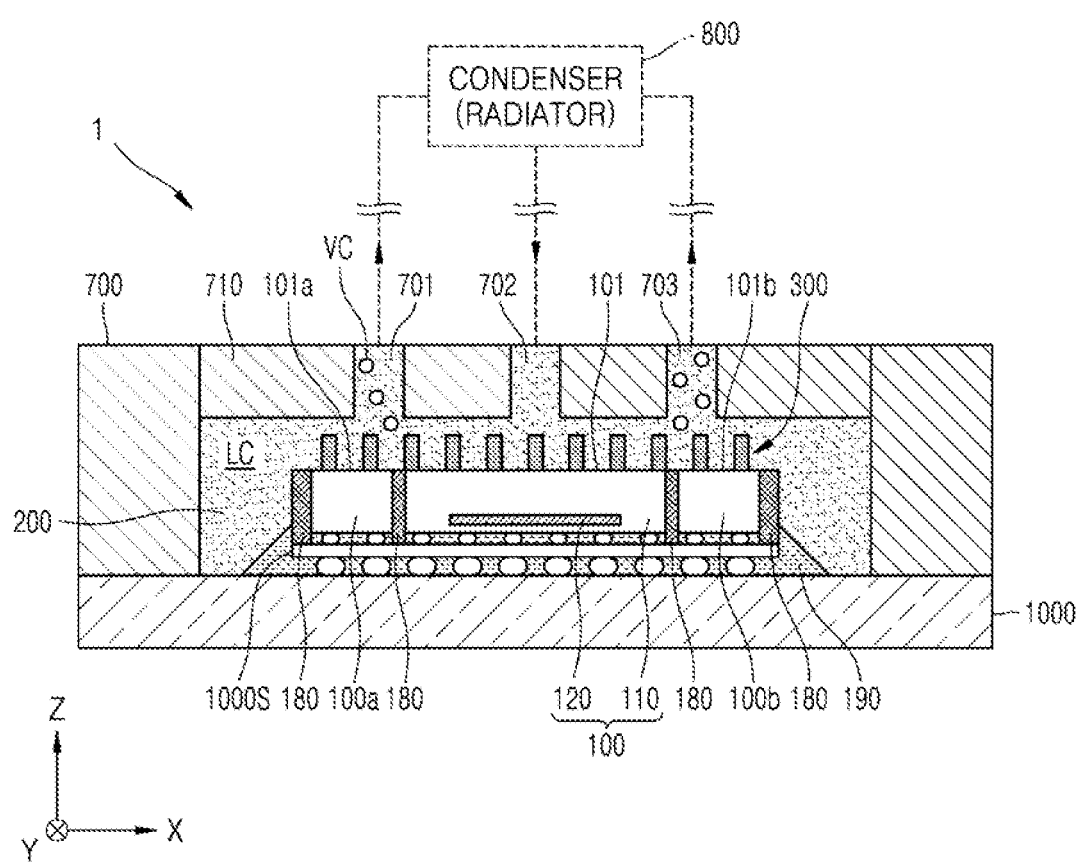
FIG. 1 is a schematic diagram of a configuration of a semiconductor device according to an embodiment.

Reference will now be made in detail to embodiments, examples of which are illustrated in the accompanying drawings, wherein like reference numerals refer to like elements throughout. In this regard, embodiments may have different forms and should not be construed as being limited to the descriptions set forth herein. Accordingly, embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Hereinafter, reference will now be made in detail to embodiments, examples of which are illustrated in the accompanying drawings. In the drawings, like reference numerals denote like elements and sizes of constituent elements may be exaggerated for convenience of explanation and clarity. Embodiments of the disclosure are capable of various modifications and may be embodied in many different forms. When a position of an element is described using an expression "above" or "on", the position of the element may include not only the element being "immediately on/under/left/right in a contact manner" but also being "on/under/left/right in a non-contact manner". Singular forms are intended to include the plural forms as well unless the context clearly indicates otherwise. When a part "comprises" or "includes" an element in the specification, unless otherwise defined, it is not excluding other elements but may further include other elements. In the specification, the term "above" and similar directional terms may be applied to both singular and plural. With respect to operations that constitute a method, the operations may be performed in any appropriate sequence unless the sequence of operations is clearly described or unless the context clearly indicates otherwise. The operations may not necessarily be performed in the order of sequence. Also, in the specification, the term "units" or " . . . modules" denote units or modules that process at least one function or operation, and may be realized by hardware, software, or a combination of hardware and software. Connections or connection members of lines between components shown in the drawings illustrate functional connections and/or physical or circuit connections, and the connections or connection members can be represented by replaceable or additional various functional connections, physical connections, or circuit connections in an actual apparatus. The use of any and all examples, or exemplary language provided herein, is intended merely to better illuminate the disclosure and does not pose a limitation on the scope of the disclosure unless otherwise claimed.

An efficient cooling system is required to solve a cooling problem that has been a limiting factor in the performance of electronic devices including semiconductor devices. In the case of high performance computing (HPC) fields and semiconductor devices to which stacked three-dimensional semiconductor integrated circuits are applied, a cooling system capable of responding to an increase in power density and an increase in heat generation due to high integration is required. In order to meet these demands, a two-phase liquid cooling system capable of utilizing latent heat of vaporization of a coolant may be applied to an integrated circuit device. The two-phase liquid cooling method may include immersion cooling, spray cooling, and jet impingement cooling.

Immersion cooling is a method of cooling an electronic device by immersing the electronic device in a bath containing a liquid coolant. The immersion cooling method is the most widely used method, but because the entire electronic device needs to be immersed in a liquid coolant, the usable coolant is limited to a dielectric coolant. Therefore, there are problems in that this method requires high management costs and is not environmentally friendly. In addition, when a film boiling phenomenon occurs in which vapor of the coolant is adsorbed to a heating surface, the vapor prevents heat transfer from the heating surface to the coolant, thereby reducing cooling efficiency. In a boiling graph, this phenomenon is called critical heat flux (CHF). It is necessary to improve the CHF to cool a larger heat flux.

Spray cooling is a method of atomizing a liquid coolant and spraying the coolant on a heating surface and has high cooling efficiency compared to the amount of liquid coolant used. However, a spray cooling device requires a pumping device capable of operating at high pressure and requires continuous maintenance of spray nozzles. The spray cooling also has a problem of lowering cooling efficiency due to a film boiling phenomenon.

Jet impingement cooling is a cooling method in which a liquid coolant is injected to a heating surface at a high speed. It shows high cooling efficiency like the spray cooling method but has a disadvantage of requiring several injectors to evenly cool the heating surface, and in addition, even if several injectors are used, there may be a blind area where the jet of liquid coolant does not reach. In addition, the jet impingement cooling also has a problem of a decrease in cooling efficiency due to a film boiling phenomenon.

The two-phase liquid cooling system according to an embodiment supplies a liquid coolant (refrigerant) to a semiconductor chip by using a capillary action to cool an object to be cooled, for example, a semiconductor chip. For this purpose, a capillary pattern is disposed in a cooling channel. The capillary pattern is formed on a surface of a semiconductor chip included in the cooling channel. The method of supplying a liquid coolant using a capillary phenomenon uses a small amount of liquid coolant and, in some cases, may supply a liquid coolant without a driving device, such as a pump, so the cooling structure may be miniaturized and is suitable for semiconductor devices including semiconductor chips. In a cooling channel, the liquid coolant absorbs heat from a heat transfer surface adjacent to a heat source and vaporizes into vapor. When vapor is stagnant or attached near the heat transfer surface and a vapor film is generated, cooling efficiency may be reduced and dry-out may occur locally. According to a two-phase cooling system of the disclosure, a capillary pattern, the curvature of which changes with temperature, is employed. The capillary pattern may include a plurality of layers having different thermal expansion coefficients. The capillary pattern may have a cantilever shape. As temperature changes, a bending direction and curvature of the capillary pattern change. Accordingly, the supply speed and amount of a liquid coolant may be adjusted according to the temperature. In addition, the cantilever-shaped capillary pattern is vibrated by vibration energy generated when the liquid coolant is vaporized. Vapors near the capillary pattern may be dislodged from the heat transfer surface by vibrational energy. Therefore, the liquid coolant may be stably supplied to the vicinity of the heat source, and the stagnation and adhesion of vapor near the heat transfer surface may be reduced or prevented.

In the following description (see, e.g., FIG. 1), a first direction (X) denotes one of the directions parallel to an upper surface of the semiconductor chip. A second direction (Z) denotes a thickness direction of the semiconductor chip. A third direction (Y) denotes a direction orthogonal to the first direction (X) among directions parallel to the upper surface of the semiconductor chip. FIG. 1 is a schematic diagram of a configuration of a semiconductor device 1 according to an embodiment. Referring to FIG. 1, the semiconductor device (integrated circuit device) 1 according to an embodiment may include at least one semiconductor chip (integrated circuit die) 100, a cooling channel 200, and a capillary pattern 300.

The number of semiconductor chips may be one or more. As an example, the at least one semiconductor chip may include the semiconductor chip 100. The semiconductor chip 100 may include a substrate 110 and a semiconductor integrated circuit 120 formed on one surface of the substrate 110. The semiconductor chip 100 may include various semiconductor chips. For example, the semiconductor chip 100 may include a memory chip (die) including a memory integrated circuit, a logic chip (die) including a logic integrated circuit, a central processing unit (CPU) chip, a graphics processing unit (GPU) chip (die), an application specific integrated circuit (ASIC) chip (die), and the like. In order to implement the semiconductor device 1 of a small form factor, the semiconductor chip 100 may be a wafer-level semiconductor chip. In this case, the substrate 110 may be a wafer.

As an example, the at least one semiconductor chip may further include semiconductor chips 100a and 100b. The semiconductor chips 100a and 100b may be arranged in a transverse direction with respect to the semiconductor chip 100, for example, in a first direction X. Each of the semiconductor chips 100a and 100b may include a substrate and a semiconductor integrated circuit formed on one surface of the substrate. The semiconductor chips 100a and 100b may include a memory chip (die) including a memory integrated circuit, a logic chip (die) including a logic integrated circuit, a CPU chip (die), a GPU chip (die), an ASIC chip (die), or the like. In order to implement the semiconductor device 1 of a small form factor, the semiconductor chips 100a and 100b may be wafer-level semiconductor chips. In this case, a substrate of each of the semiconductor chips 100a and 100b may be a wafer. For example, the semiconductor chip 100 may be a CPU or GPU. The semiconductor chips 100a and 100b may be memory chips (die), for example, high bandwidth memory (HBM) chips (die).

The semiconductor chips 100, 100a, and 100b are mounted on a sub-substrate 1000S, and an assembly of the semiconductor chips 100, 100a, and 100b and the sub-substrate 1000S may be mounted, for example, on a printed circuit board 1000 by solder balls. Lower surfaces of the semiconductor chips 100, 100a, and 100b and an upper surface of the sub-substrate 1000S may be electrically passivated by, for example, a passivation member 180. A lower surface of the sub-substrate 1000S and an upper surface of the printed circuit board 1000 may be electrically passivated by a passivation layer 190. The passivation member 180 and the passivation layer 190 may function as a sealing material for a coolant.

A two-phase liquid cooling structure may include the cooling channel 200. The cooling channel 200 forms a passage for a coolant (refrigerant) to cool the at least one semiconductor chip 100. The cooling channel 200 may include at least a surface of the semiconductor chip 100, for example, an upper surface 101. In an embodiment, the cooling channel 200 includes upper surfaces 101a, 101, and 101b of the semiconductor chips 100a, 100, and 100b to cool the semiconductor chips 100a, 100, and 100b. For example, the semiconductor chips 100, 100a, and 100b may be packaged by a package housing 700. The package housing 700 surrounds the semiconductor chips 100, 100a, and 100b. The cooling channel 200 may be formed by a space between the package housing 700 and the semiconductor chips 100, 100a, and 100b. At least one of the upper surfaces 101a, 101, and 101b of the semiconductor chips 100a, 100, and 100b is in contact with a coolant accommodated in the cooling channel 200. One or more openings communicating with the cooling channel 200, for example, openings 701, 702, and 703 may be provided in an upper wall 710 of the package housing 700. The cooling channel 200 is connected to a condenser (or radiator) 800 by the openings 701, 702, and 703. The cooling channel 200 and the condenser (or radiator) 800 form a two-phase liquid cooling system. A coolant storage unit may be provided between the condenser 800 and the opening 702. The liquid coolant condensed in the condenser 800 is received in the coolant storage unit and may be supplied from the coolant storage unit to the cooling channel 200 through the opening 702. The upper wall 710 of the package housing 700 forming an upper wall of the cooling channel 200 may be a cold plate having a heat dissipation function. The cold plate may function as a condenser (or radiator) 800. In this case, the openings 701, 702, and 703 may not be provided, and the coolant in the cooling channel 200 dissipates heat to the outside by heat exchange with the upper wall 710 of the package housing 700. A cold plate, such as a heat sink, may be provided outside the upper wall 710 of the package housing 700.

The capillary pattern 300 is provided inside the cooling channel 200. The capillary pattern 300 may be provided on a heat transfer surface. The capillary pattern 300 moves a liquid coolant along the heat transfer surface by capillary action. That is, the capillary pattern 300 moves the liquid coolant inside the cooling channel 200 to the heat transfer surface. In addition, because the capillary pattern 300 increases a surface area of the heat transfer surface, heat exchange efficiency may be increased.

Because the liquid coolant inside the cooling channel 200 contacts the surface of the semiconductor chip 100 and receives heat from the semiconductor chip 100, the surface of the semiconductor chip 100 performs as a heat transfer surface. The capillary pattern 300 may be provided on the surface of the semiconductor chip 100, for example, the upper surface 101. The liquid coolant may be effectively supplied to the surface of the semiconductor chip 100, for example, the upper surface 101 by the capillary phenomenon, and the surface area of the heat transfer surface may be increased. In the embodiment, the capillary pattern 300 is provided on the upper surfaces 101, 101a, and 101b of the semiconductor chips 100, 100a, and 100b. Of course, the capillary pattern 300 may be provided on the upper surface 101 of the semiconductor chip 100 and may not be provided on the upper surfaces 101a and 101b of the semiconductor chips 100a and 100b.

Figure 2A:
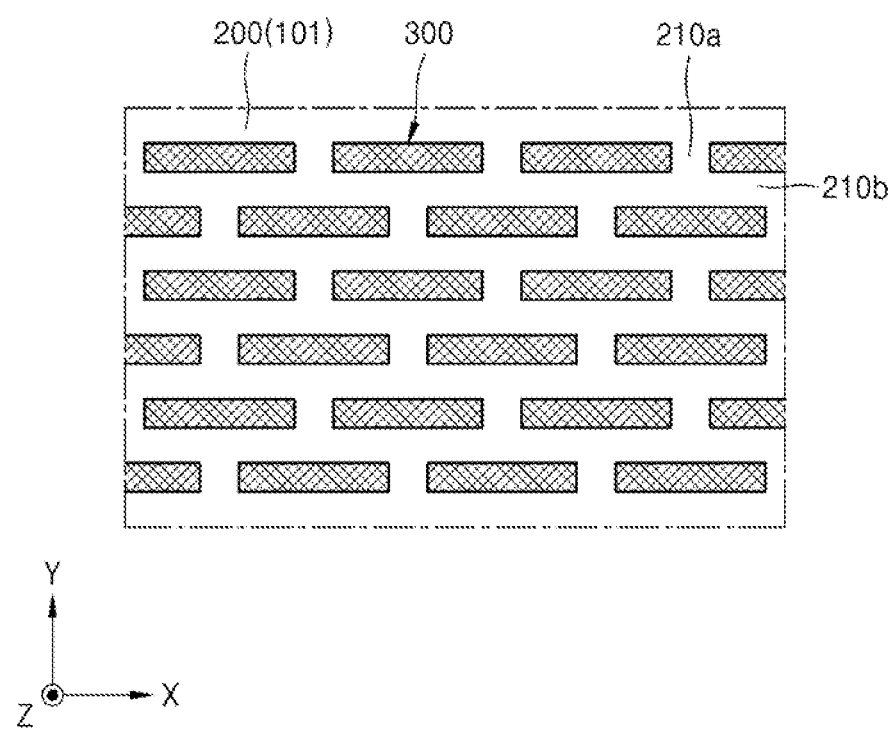
FIGS. 2A to 2C are plan views showing various examples of arrangement of a plurality of capillary patterns.
Figure 2B:
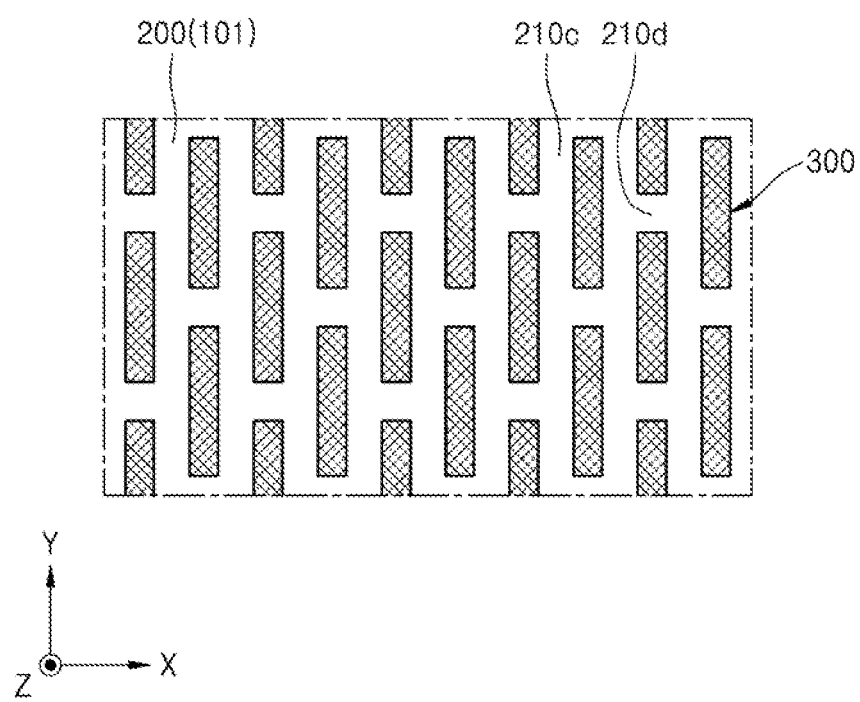
Figure 2C:
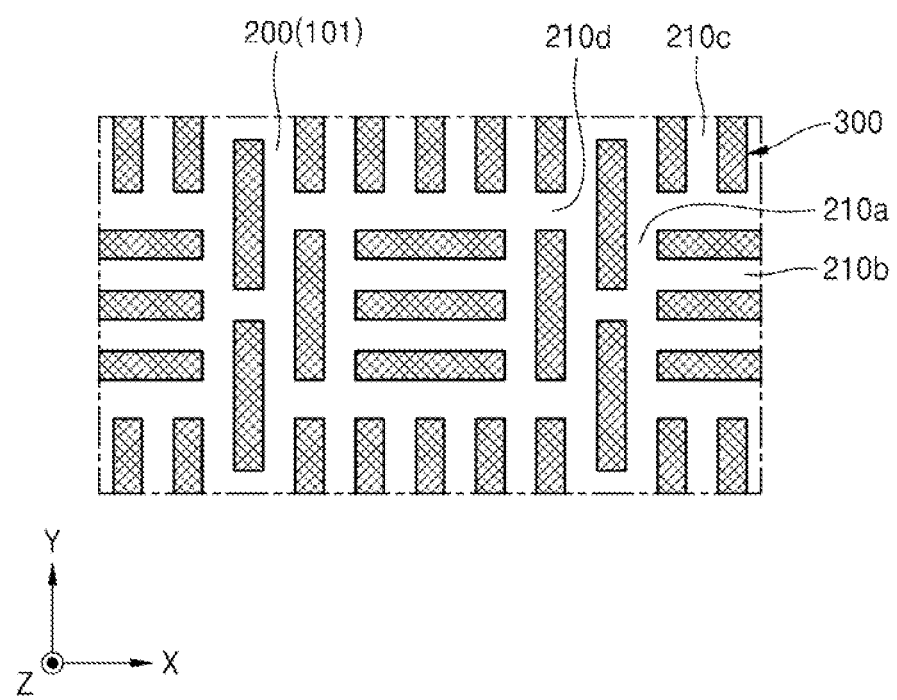

A plurality of capillary patterns 300 may be arranged on the surfaces, for example, the upper surfaces 101, 101a, and 101b of the semiconductor chips 100, 100a, and 100b. Hereinafter, as an example, a form in which a plurality of capillary patterns 300 are arranged on the surface of the semiconductor chip 100, for example, the upper surface 101, are described, and the arrangement of the plurality of capillary patterns 300 may be the same on the surfaces, for example, the upper surfaces 101a and 101b of the semiconductor chips 100a and 100b. FIGS. 2A to 2C are plan views showing various examples of the arrangement of a plurality of capillary patterns 300.

First, referring to FIG. 2A which shows at least some of the capillary patterns 300, each capillary pattern 300 has a length in a first direction (X), a thickness in a second direction (Z), and a width in a third direction (Y). The plurality of capillary patterns 300 are two-dimensionally arranged on the upper surface 101 of the semiconductor chip 100. A capillary channel 210a is formed between two capillary patterns 300 adjacent to each other in the first direction (X). A capillary channel 210b extending in the first direction (X) is formed between two capillary patterns 300 adjacent to each other in the third direction (Y). The plurality of capillary channels 210b communicate with each other through the plurality of capillary channels 210a. A liquid coolant may be moved by a capillary force through the capillary channel 210a and the capillary channel 210b.

Referring to FIG. 2B which shows at least some of the capillary patterns 300, each capillary pattern 300 has a length in the third direction (Y), a thickness in the second direction (Z), and a width in the first direction (X). The plurality of capillary patterns 300 are two-dimensionally arranged on the upper surface 101 of the semiconductor chip 100. A capillary channel 210c extending in the third direction (Y) is formed between two capillary patterns 300 adjacent to each other in the first direction (X). A capillary channel 210d is formed between two capillary patterns 300 adjacent to each other in the third direction (Y). The plurality of capillary channels 210c communicate with each other through the plurality of capillary channels 210d. The liquid coolant may be moved by capillary force through the capillary channel 210c and the capillary channel 210d.

Referring to FIG. 2C, the arrangement shown in FIG. 2A and the arrangement shown in FIG. 2B are combined. As a result, the capillary channel 210b extending in the first direction (X), the capillary channel 210c extending in the third direction (Y), and the capillary channel 210a and the capillary channel 210d that communicate with the capillary channel 210b and the capillary channel 210c are formed. The liquid coolant may be moved by capillary force through the capillary channels 210a, 210b, 210c, and 210d.

The arrangement of the capillary pattern 300 is not limited to the examples shown in FIGS. 2A to 2C. The capillary pattern 300 may extend in an arbitrary direction within the transverse plane, and the plurality of capillary patterns 300 may be arranged in any direction as long as they form capillary channels generating capillary forces. Lengths of the plurality of capillary patterns 300 may all be the same, and some of the capillary patterns 300 may have different lengths from the rest of the capillary patterns 300.

Figure 3:
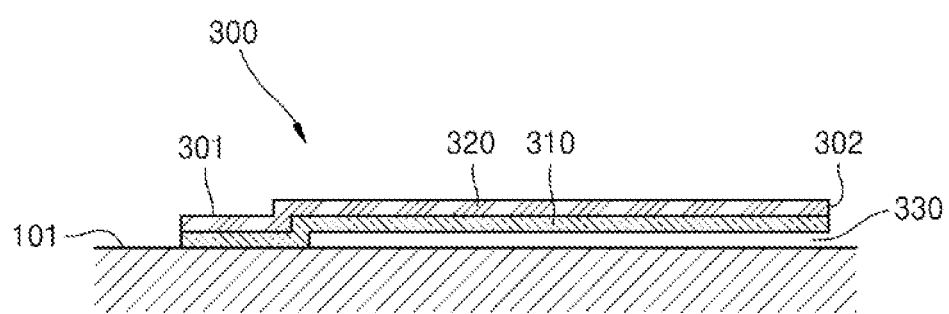
FIG. 3 is a cross-sectional view of a capillary pattern in a length direction, according to an embodiment.

FIG. 3 is a cross-sectional view of a capillary pattern in a length direction, according to an embodiment. Referring to FIG. 3, the capillary pattern 300 has a cantilever shape. One end (first portion) 301 of the capillary pattern 300 in the length direction is fixed to a surface of the semiconductor chip 100, for example, the upper surface 101, and the other end (second portion) 302 is free. The capillary pattern 300 may have a flexible cantilever shape, a curvature of which changes according to temperature. A distance between the capillary pattern 300 and the surface of the semiconductor chip 100, for example, the upper surface 101 changes according to temperature. This means that the shape and size of the capillary channel formed between the capillary pattern 300 and the upper surface 101 of the semiconductor chip 100 changes according to temperature. Of course, as described below with reference to FIGS. 4D and 4E, in the case when the capillary pattern 300 is in a roll form, the shape and size of the capillary channel inside the roll shape of the capillary pattern 300 also change according to temperature. Accordingly, according to temperature change, an appropriate amount of the liquid coolant LC may be effectively supplied to the upper surface 101 of the semiconductor chip 100, which is a heat transfer surface.

The capillary pattern 300 may include a plurality of layers stacked in a thickness direction, that is, in the second direction (Z). At least one of the plurality of layers has a different thermal expansion coefficient than the other layers. For example, the capillary pattern 300 may include a first layer 310 and a second layer 320. The first layer 310 is close to the surface of the semiconductor chip 100, for example, the upper surface 101, and the second layer 320 is far from the surface of the semiconductor chip 100, for example, the upper surface 101. In other words, a distance from the first layer 310 to the upper surface 101 is smaller than a distance from the second layer 320 to the upper surface 101. The second layer 320 may be formed by being stacked on the first layer 310. The first layer 310 may be spaced apart from the upper surface 101 of the semiconductor chip 100. Accordingly, a gap 330 is formed between the surface of the semiconductor chip 100, for example, the upper surface 101 and the capillary pattern 300. This gap may function as a capillary channel creating a capillary force. Accordingly, a coolant may be more easily supplied to the surface of the semiconductor chip 100, for example, the upper surface 101. Also, because a surface area of the surface of the semiconductor chip 100, for example, the upper surface 101 directly exposed to the coolant is increased, the cooling efficiency may be improved.

The first layer 310 and the second layer 320 include materials having different thermal expansion coefficients from each other. The thermal expansion coefficient of the first layer 310 may be greater or less than that of the second layer 320. Because the amount of expansion of the first layer 310 and the second layer 320 is different due to the difference in thermal expansion coefficient between the first layer 310 and the second layer 320, the cantilever-shaped capillary pattern 300 is bent. The curvature of the capillary pattern 300 varies according to temperature. The first layer 310 and the second layer 320 may include, for example, materials having different thermal expansion coefficients, such as metals, oxides, nitrides, etc. The metal may include, for example, Ti, Ta, Cu, Cr, Al, Mo, Ni, W, and the like. The oxides may include, for example, $SiO_2$, $Al_2O_3$, and the like. The nitride may include, for example, SiN, AlN, TiN, TaN, and the like. In the case of a combination in which the thermal expansion coefficient of the first layer 310 is greater than that of the second layer 320, the first layer 310 may include a metal having a greater thermal expansion coefficient, and the second layer 320 may include a metal, oxide, nitride, etc. having a relatively small thermal expansion coefficient. Examples of combination of the first layer 310/second layer 320 may include Al/Mo, Cu/Ni, Al/SiN, Al/$SiO_2$, etc. Conversely, examples of combination of the first layer 310/second layer 320 when the thermal expansion coefficient of the second layer 320 is greater than that of the first layer 310 include Mo/Al, Cr/Al, TiN/Al, SiN/Cu, $SiO_2$/Mo, etc.

The capillary pattern 300 of this type may be formed by using various manufacturing methods. As an example, a sacrificial layer is formed on the surface of the semiconductor chip 100, for example, on the upper surface 101. The first layer 310 and the second layer 320 are stacked on the sacrificial layer. Then, the first layer 310 and the second layer 320 are patterned according to a shape of the capillary pattern 300. Then, when the sacrificial layer is removed, the capillary pattern 300 according to an embodiment may be formed. The method of forming the capillary pattern 300 is not limited to the method described above.

Depending on the combination of thermal expansion coefficients of the first layer 310 and the second layer 320, a bending direction and amount of bending of the capillary pattern 300 according to temperature may be determined. A combination of thermal expansion coefficients of the first layer 310 and the second layer 320 and parameters, such as a thickness, length, and width of the capillary pattern 300 may be appropriately determined considering a calorific value of the semiconductor chip 100 and a coolant flow rate required to cool the semiconductor chip 100.

Hereinafter, a behavior of the capillary pattern 300 according to a difference in thermal expansion coefficient between the first layer 310 and the second layer 320 is described. In the following description, as an example, a case when the capillary pattern 300 is formed on the upper surface 101 of the semiconductor chip 100 is described, and the behavior of the capillary patterns 300 installed on the upper surfaces 101a and 101b of the semiconductor chips 100a and 100b may also be the same.

FIGS. 4A to 4E show example shapes of the capillary pattern 300. In FIGS. 4A to 4E, the capillary pattern 300 is schematically shown in a cantilever shape in which one end 301 is supported on the upper surface 101 of the semiconductor chip 100 and the other end 302 is free. The capillary pattern 300 may have, for example, any one of the shapes shown in FIGS. 4A to 4E. An initial shape of the capillary pattern 300 may be determined by a difference in residual stress and stiffness between the first layer 310 and the second layer 320, and the thickness, width, length, and initial temperature of the capillary pattern 300.

Figure 4A:
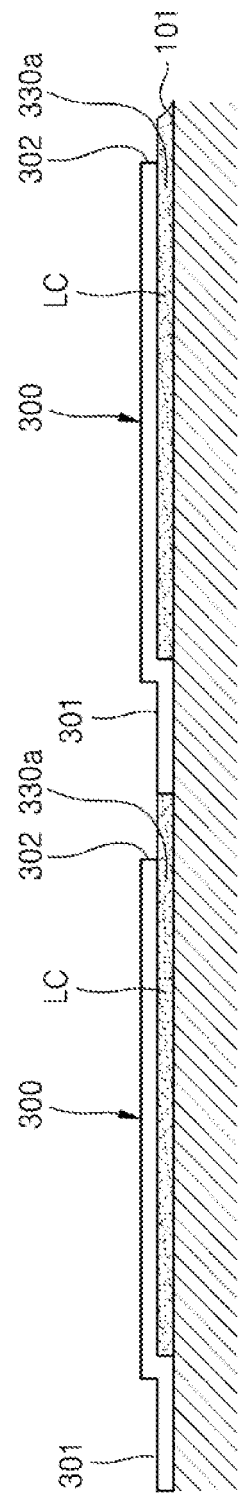
FIGS. 4A to 4E show example shapes of capillary patterns.
Figure 4B:
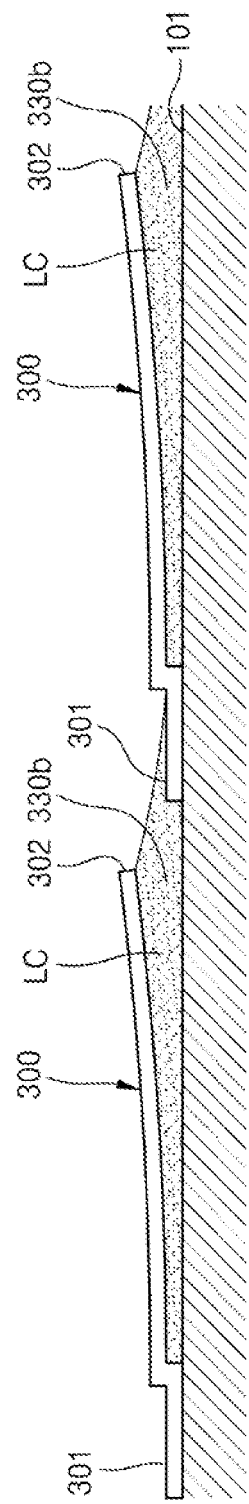
Figure 4C:
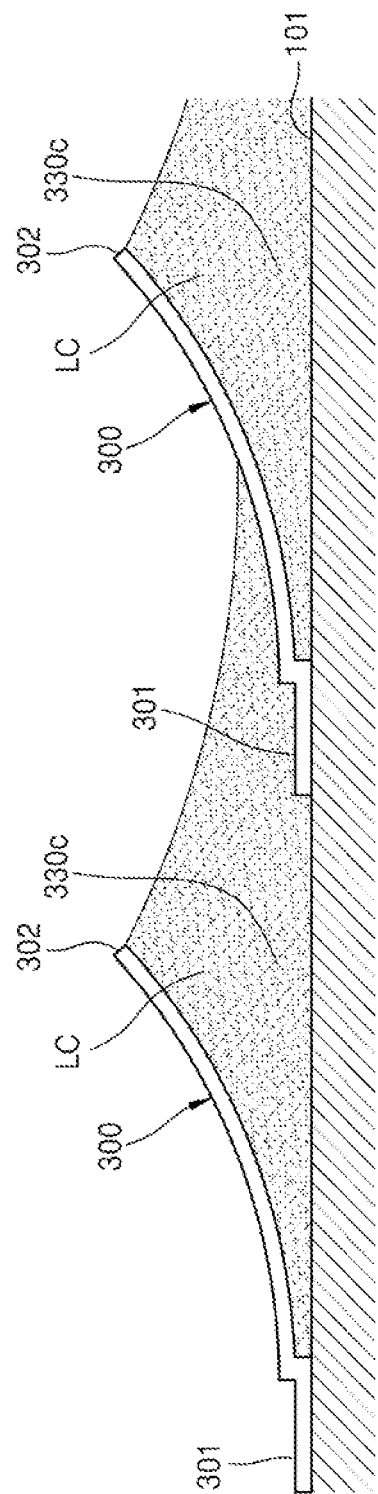
Figure 4D:
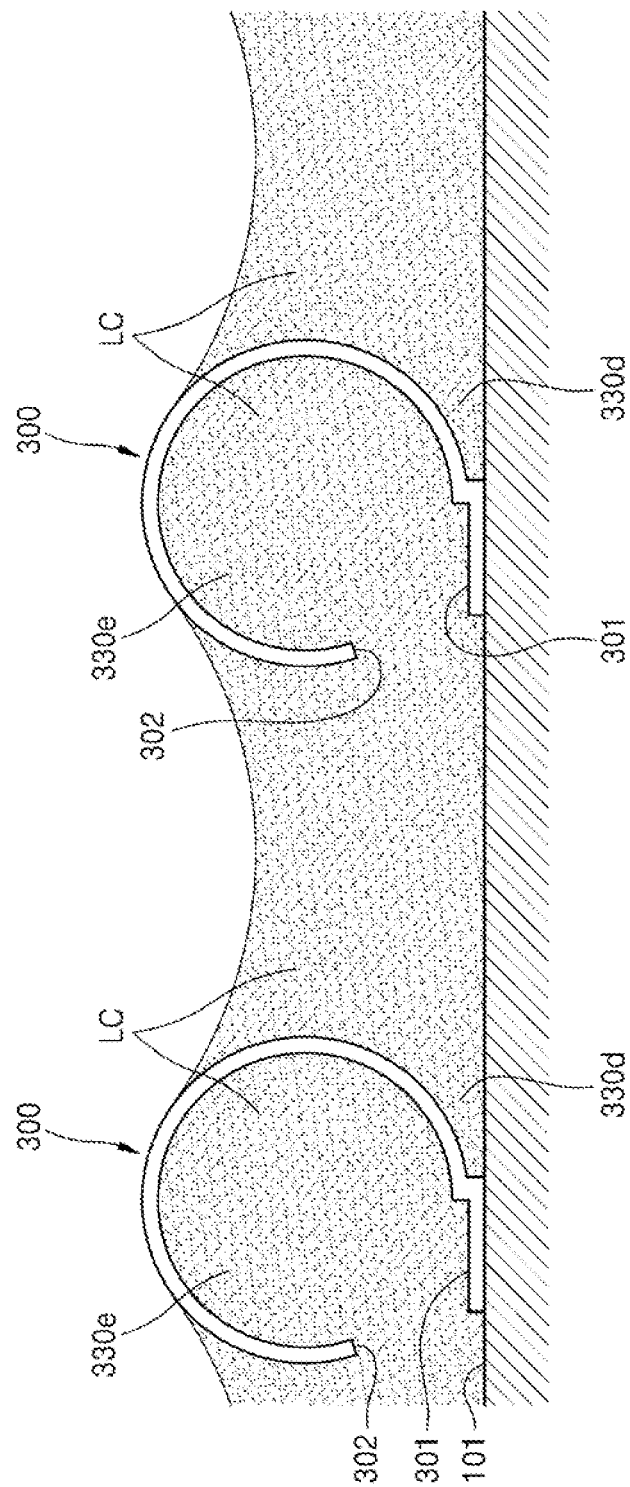
Figure 4E:
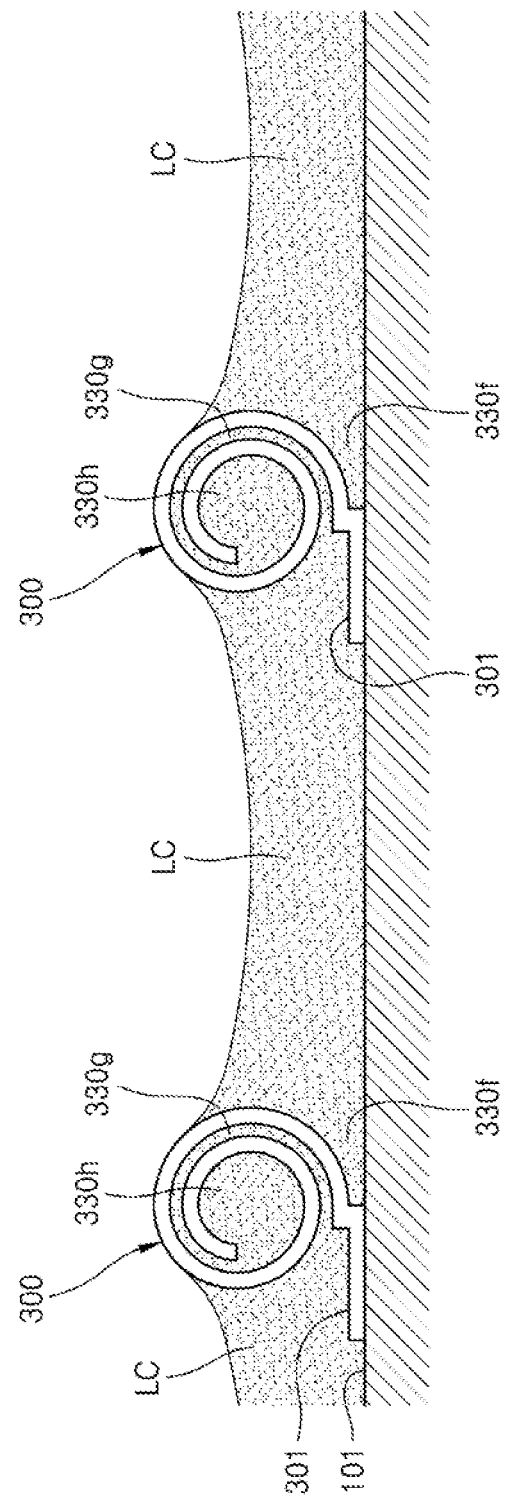

As an example, the capillary pattern 300 may initially be substantially parallel to the upper surface 101 of the semiconductor chip 100 as shown in FIG. 4A. As an example, in the capillary pattern 300, the thermal expansion coefficient of the first layer 310 is greater than that of the second layer 320. In this state, a space 330a is formed between the capillary pattern 300 and the upper surface 101 of the semiconductor chip 100, and the space 330a functions as a capillary channel. The space 330a is filled with a liquid coolant LC introduced by the capillary phenomenon. In addition, a space between the adjacent capillary patterns 300 may also act as a capillary channel and may be filled with the liquid coolant LC. As temperature rises, the other end 302 of the capillary pattern 330 is separated from the upper surface 101 of the semiconductor chip 100 and is bent as shown by a solid line in FIG. 4B. Accordingly, a space 330b is created between the capillary pattern 300 and the upper surface 101 of the semiconductor chip 100. A size of the space 330b is greater than the space 330a shown in FIG. 4A. The space 330b serves as a capillary channel, and an inside of the space 330b is filled with the liquid coolant LC. In addition, a space between adjacent capillary patterns 300 may also act as a capillary channel and may be filled with the liquid coolant LC. As the temperature further rises, the bending of the capillary pattern 300 increases as shown in FIG. 4C, and thus, a larger space 330c serving as a capillary channel may be formed between the capillary pattern 300 and the upper surface 101 of the semiconductor chip 100. In addition, a space between adjacent capillary patterns 300 may also act as a capillary channel and may be filled with the liquid coolant LC. A curvature of the capillary pattern 300 shown in FIG. 4C is greater than the curvature of the capillary pattern 300 shown in FIG. 4B. As the temperature increases, the curvature of the capillary pattern 300 may gradually increase. The capillary pattern 300 may be in the form of a roll as shown in FIG. 4D. At this time, at least one of the space 330 between the roll-shaped capillary pattern 300 and the upper surface 101 of the semiconductor chip 100 and an inner space 330e of the roll-shaped capillary pattern 300 may act as a capillary channel, and the liquid coolant LC may be filled in the space 330d and/or the inner space 330e serving as a capillary channel. In addition, the space between adjacent capillary patterns 300 may also act as a capillary channel and may be filled with the liquid coolant LC. As shown in FIG. 4E, the capillary pattern 300 may be in the form of a roll wound one or more times. At this time, at least one of a space 330f between the roll-shaped capillary pattern 300 and the upper surface 101 of the semiconductor chip 100, a space 330g between rolls of the roll-shaped capillary pattern 300, and an innermost space 330h of the roll-shaped capillary pattern 300 may act as capillary channels, and among the spaces 330f, 330g, and 330h, a space that acts as a capillary channel may be filled with the liquid coolant LC. In addition, the space between adjacent capillary patterns 300 may also act as a capillary channel and may be filled with the liquid coolant LC. The capillary pattern 300 is changed to one of the shapes shown in FIGS. 4A to 4E according to the temperature of the liquid coolant LC, and accordingly, the gap between the surface of the semiconductor chip 100, for example, the upper surface 101 and the capillary pattern 300 is changed, and thus, capillary force may be generated to continuously supply the liquid coolant LC to the upper surface 101 of the semiconductor chip 100.

When the thermal expansion coefficient of the first layer 310 is greater than that of the second layer 320, as the temperature rises, as described above, the other end 302, which is a free end, of the capillary pattern 300 rotates in a counterclockwise direction, and thus, the curvature of the capillary pattern 300 gradually increases. When the thermal expansion coefficient of the first layer 310 is less than that of the second layer 320, as the temperature rises, the other end 302, which is a free end, of the capillary pattern 300 rotates in a clockwise direction, and thus, the curvature of the capillary pattern 300 gradually increases.

The capillary pattern 300 may have a bent shape initially, for example, as any one of the shapes shown in FIGS. 4B to 4E due to the combination of thermal expansion coefficients of the first layer 310 and the second layer 320 and residual stress during manufacture. Of course, the initial shape of the capillary pattern 300 may be a shape bent in an opposite direction to the shape shown in FIGS. 4B to 4E.

For example, the initial shape of the capillary pattern 300 may be a roll shape shown in FIG. 4C. When the thermal expansion coefficient of the first layer 310 is greater than that of the second layer 320, the capillary pattern 300 may be bent in the form shown in FIGS. 4D and 4E as a temperature rises. When the coefficient of thermal expansion of the first layer 310 is less than the coefficient of thermal expansion of the second layer 320, the capillary pattern 300 may unfold in the form shown in FIGS. 4B and 4A as the temperature rises.

For example, the initial shape of the capillary pattern 300 may be a roll shape shown in FIG. 4D. When the thermal expansion coefficient of the first layer 310 is greater than that of the second layer 320, the capillary pattern 300 may be bent as shown in FIG. 4E as the temperature increases. When the thermal expansion coefficient of the first layer 310 is less than that of the second layer 320, the capillary pattern 300 may unfold in the form shown in FIGS. 4C, 4B, and 4A as the temperature rises. Of course, the initial shape of the capillary pattern 300 may be the roll shape shown in FIG. 4E.

An initial shape of the capillary pattern 300, a combination of residual stress and stiffness of the first layer 310 and the second layer 320, a combination of thermal expansion coefficients, parameters such as thickness, width, and length of the capillary pattern 300 may be determined to be able to supply a liquid coolant LC to the upper surface 101 of the semiconductor chip 100 at a flow rate sufficient enough to cool the semiconductor chip 100 through a capillary channel created by bending of the capillary pattern 300 considering the calorific value of the semiconductor chip 100.

A liquid coolant LC is filled inside capillary channels formed by the capillary pattern 300. Because the capillary pattern 300 is formed on a surface of the semiconductor chip 100, for example, the upper surface 101 which is a heat exchange surface, the liquid coolant LC may be continuously supplied to the heat exchange surface by a capillary phenomenon. The liquid coolant LC absorbs heat from a heat source inside the semiconductor chip 100, for example, the semiconductor integrated circuit 120. The heated liquid coolant LC is cooled by heat exchange with the outside in a condenser (or radiator) 800 or a cold plate and is re-supplied to the cooling channel 200. The liquid coolant LC in the capillary channel may vaporize into a coolant vapor VC. The coolant vapor VC moves along the cooling channel 200 to the condenser (or radiator) 800. The coolant vapor VC is phase-changed into a liquid coolant LC in the condenser (or radiator) 800, and then re-supplied to the cooling channel 200. Of course, the coolant vapor VC may be phase-changed into the liquid coolant LC by heat exchange with the outside in the cold plate, and then supplied to the cooling channel 200 again. A space inside the capillary channel from which the coolant vapor VC leaves is filled with the liquid coolant LC supplied by capillary force. The semiconductor chips 100, 100a, and 100b may be effectively cooled by using latent heat of evaporation during a phase change process of the liquid coolant.

Local overheating of the semiconductor chip 100 may cause local dry-out on the inside of the cooling channel 200, for example, on the upper surface 101 of the semiconductor chip 100, which is a heat transfer surface. Because the liquid coolant LC is not supplied to the area where dry-out occurs, the area where the dry-out occurs may be further overheated. A curvature of the cantilever-shaped capillary pattern 300 is changed according to the temperature of the liquid coolant LC, and thereby the size and shape of the capillary channel between the capillary pattern 300 and the upper surface 101 of the semiconductor chip 100 and/or the capillary channel of the inside of the capillary pattern 300 are also changed. By properly determining an initial shape of the capillary pattern 300, a combination of thermal expansion coefficients of the first layer 310 and the second layer 320, parameters such as thickness, width, and length of the capillary pattern 300, an appropriate flow rate of the liquid coolant LC may be supplied to the upper surface 101 of the semiconductor chip 100. In this way, the dry-out due to local overheating of the semiconductor chip 100 may be reduced or prevented.

For effective cooling, coolant vapor VC generated inside the cooling channel 200 is needed to be discharged to the outside of the cooling channel 200. The coolant vapor VC may be stagnant near a wall surface of the cooling channel 200, for example, the upper surface 101 of the semiconductor chip 100 adjacent to the semiconductor integrated circuit 120, which is a heat source. When the coolant vapor VC near the upper surface 101 of the semiconductor chip 100 is bonded to each other and attached to the upper surface 101 of the semiconductor chip 100, a vapor film may be formed. The stagnant vapor and vapor film may interfere with the contact between the liquid coolant LC and the upper surface 101 of the semiconductor chip 100, resulting in an increase in thermal resistance, and as a result, a hot spot may be locally generated inside the semiconductor chip 100. According to an embodiment, the cantilever-shaped capillary pattern 300 may cause coolant vapor VC to move in the capillary channel while the curvature changes according to temperature and may discharge the coolant vapor VC from the capillary channel. In addition, the movement of the capillary pattern 300 according to the change in curvature excites the liquid coolant LC, and the stagnant coolant vapor VC and/or the vapor film may be dispersed by the excited liquid coolant LC. In addition, the capillary pattern 300 is vibrated by the movement of the liquid coolant LC and the coolant vapor VC generated while boiling the liquid coolant LC, and the vibration of the capillary pattern 300 causes the movement of the coolant vapor VC around the capillary pattern 300, and thus, the stagnant coolant vapor VC and/or vapor films may disperse. Accordingly, the liquid coolant LC may be stably supplied to the vicinity of the heat transfer surface, that is, to the upper surface 101 of the semiconductor chip 100, and vapor stagnation and adhesion near the heat transfer surface may be reduced or prevented.

Figure 5A:
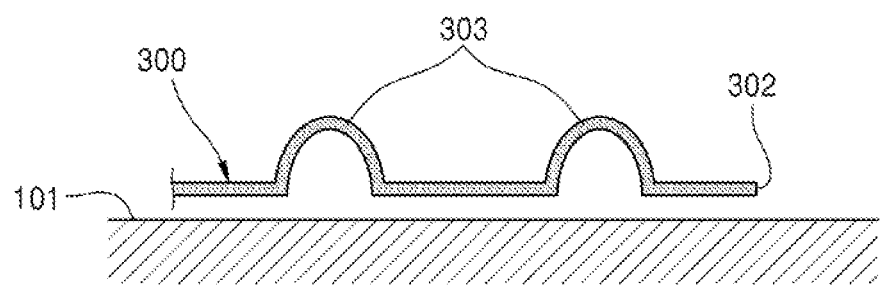
FIG. 5A shows a capillary pattern according to an embodiment.

FIG. 5A shows a capillary pattern 300 according to an embodiment. In order to clarify the characteristics of the embodiment, in FIG. 5A, the capillary pattern 300 is simply shown without distinction between the first layer 310 and the second layer 320. Referring to FIG. 5A, the capillary pattern 300 may include a plurality of curved units (curved portions) 303. The plurality of curved units 303 open toward the surface of the semiconductor chip 100, for example, the upper surface 101, and are convex in a direction opposite to the upper surface 101. An amount of change in the curvature of the capillary pattern 300 according to temperature is changed by a size, spacing, number, etc. of the curved units 303. The size, spacing, number, etc. of the curved units 303 may be determined so that the curvature of the capillary pattern 300 is in an appropriate state for cooling the semiconductor chip 100 according to temperature. Because a space between the curved units 303 and the upper surface 101 of the semiconductor chip 100 acts as a capillary channel, even if a gap between the capillary pattern 300 and the upper surface 101 of the semiconductor chip 100 is narrow, a capillary channel having a sufficient size is formed, and thus, the liquid coolant LC may be sufficiently supplied to the upper surface 101 of the semiconductor chip 100. In addition, the curved units 303 may function as an anti-distortion unit that reduces or prevents the capillary pattern 300 from being distorted in a width direction when the curvature changes as the capillary pattern 300 is curved. To this end, the curved units 303 may extend in a width direction perpendicular to the length direction of the capillary pattern 300.

Figure 5B:
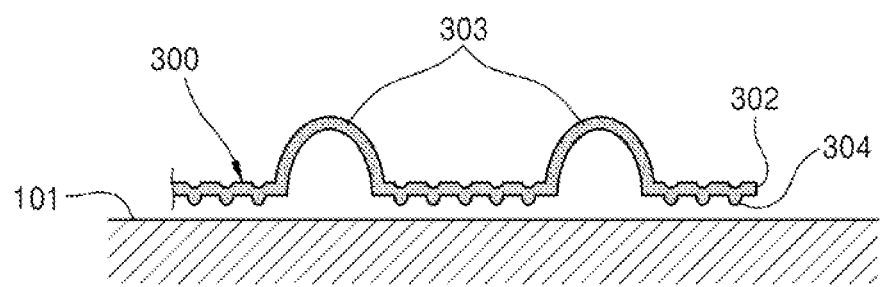
FIG. 5B shows a capillary pattern according to an embodiment.

FIG. 5B shows a capillary pattern 300 according to an embodiment. In order to clarify the characteristics of the embodiment, in FIG. 5B, the capillary pattern 300 is simply shown without distinction between the first layer 310 and the second layer 320. Referring to FIG. 5B, when sagging of the capillary pattern 300 occurs, the capillary pattern 300 may contact the upper surface 101 of the semiconductor chip 100. When stiction occurs due to a surface contact between the capillary pattern 300 and the upper surface 101 of the semiconductor chip 100, an abnormal behavior, such as the capillary pattern 300 not bending or being distorted, may occur even when the temperature changes. The capillary pattern 300 according to an embodiment includes an anti-adhesion unit. As an example, the anti-adhesion unit may include a plurality of protrusions 304 formed on, for example, a surface of the capillary pattern 300 facing the upper surface 101 of the semiconductor chip 100. Therefore, even if sagging of the capillary pattern 300 occurs, because the plurality of protrusions 304 contact the upper surface 101 of the semiconductor chip 100, a surface contact between the capillary pattern 300 and the upper surface 101 of the semiconductor chip 100 and resulting adhesion may be minimized or prevented. In addition, because the plurality of protrusions 304 form a plurality of fine capillary channels therebetween and thus form a thin and uniform coolant film on the upper surface 101 of the semiconductor chip 100, cooling efficiency may be improved.

Figure 5C:
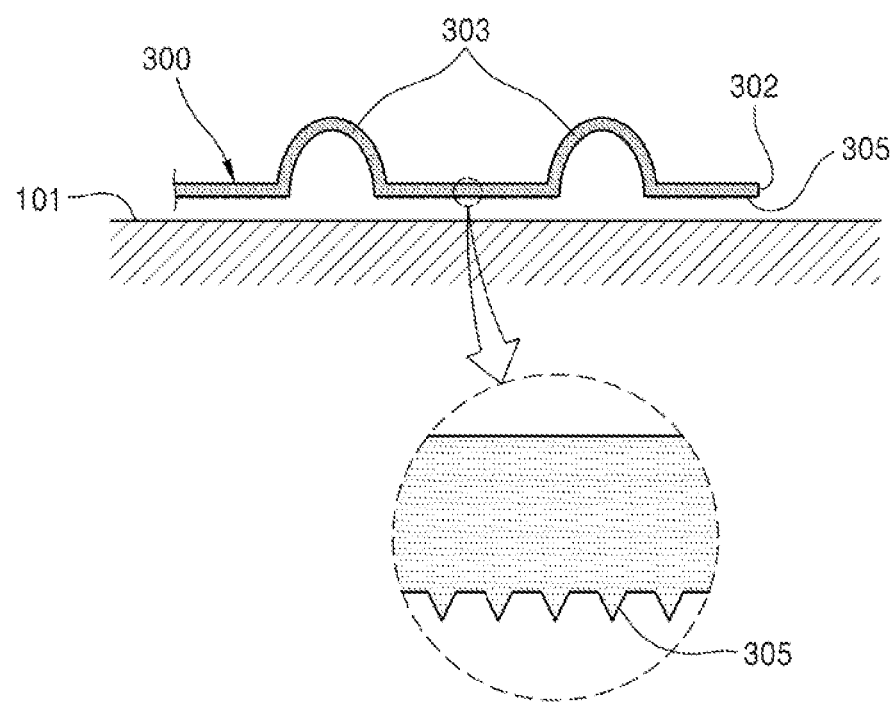
FIG. 5C shows a capillary pattern according to an embodiment.

FIG. 5C shows a capillary pattern 300 according to an embodiment. In order to clarify the characteristics of the embodiment, the capillary pattern 300 in FIG. 5C is simply shown without distinction between the first layer 310 and the second layer 320. Referring to FIG. 5C, as an embodiment, the anti-adhesion unit may include a surface roughness structure 305 on a surface of the capillary pattern 300, for example, a surface facing the upper surface 101 of the semiconductor chip 100. Accordingly, an effect similar to that of the plurality of protrusions 304 described above may be obtained.

In the above, the capillary pattern 300 formed on the upper surface 101 of the semiconductor chip 100 has been described, and the above descriptions may also be equally applied to the capillary pattern 300 formed on the upper surfaces 101a and 101b of the semiconductor chips 100a and 100b.

Figure 6:
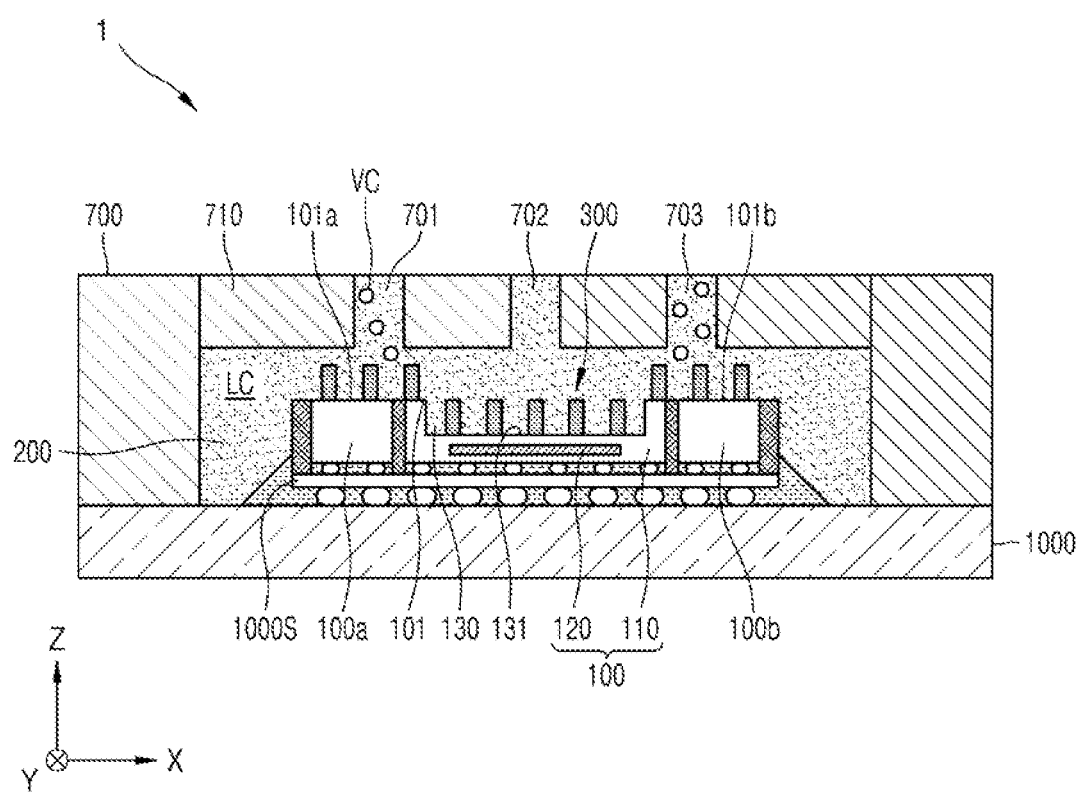
FIG. 6 is a schematic diagram of a configuration of a semiconductor device according to an embodiment.

The cooling channel 200 may also be formed inside the semiconductor chip 100. FIG. 6 is a schematic diagram of a configuration of the semiconductor device 1 according to an embodiment. The semiconductor device 1 shown in FIG. 6 is different from the semiconductor device 1 shown in FIG. 1 in that a cooling channel 200 is formed even inside the semiconductor chip 100, that is, inside the substrate 110. Hereinafter, differences will be mainly described below, and the descriptions given with reference to FIGS. 1 to 5 may also be applied to the embodiment shown in FIG. 6.

Referring to FIG. 6, an immersed unit 130 (e.g., a groove) immersed from the upper surface 101 is provided in the semiconductor chip 100. For example, the immersed unit 130 may be formed by partially etching the substrate 110. The cooling channel 200 includes an immersed unit 130. The capillary pattern 300 may be formed on the immersed unit 130, for example, on a bottom 131 of the immersed unit 130. According to the configuration, the surface of the semiconductor chip 100 is the bottom 131 of the immersed unit 130. The bottom 131 of the immersed unit 130 is closer to the semiconductor integrated circuit 120 than the upper surface 101 of the semiconductor chip 100. As a result, because a coolant may be supplied to a location close to the semiconductor integrated circuit 120 which is a heat source, the semiconductor chip 100 may be more effectively cooled. The cooling channel 200 may include an upper surface 101 of the semiconductor chip 100 and the immersed unit 130. In this case, the surface of the semiconductor chip 100 includes the upper surface 101 and the bottom 131 of the immersed unit 130.

According to the embodiments described above, a semiconductor device employing a two-phase liquid cooling structure capable of effectively supplying a liquid coolant to a heat transfer surface may be implemented. In addition, a semiconductor device employing a two-phase liquid cooling structure capable of coping with a decrease in cooling efficiency due to vapor adsorption to a heat transfer surface may be implemented.

The semiconductor device of the disclosure has been described with reference to the embodiments shown in the drawings. However, it will be understood by those of ordinary skill in the art that various changes in form and details may be made therein without departing from the spirit and scope of the disclosure. Therefore, the embodiments should be considered in descriptive sense only and not for purposes of limitation. The scope of the disclosure is defined not by the detailed description of the disclosure but by the appended claims, and all differences within the scope will be construed as being included in the disclosure.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A semiconductor device comprising:
a semiconductor chip comprising a semiconductor integrated circuit;
a cooling channel comprising a surface of the semiconductor chip and configured to provide a passage for a coolant to cool the semiconductor chip; and
a plurality of flexible capillary patterns on the surface of the semiconductor chip inside the cooling channel and configured to move the coolant by capillary action,
wherein each capillary pattern of the plurality of flexible capillary patterns comprises a first portion in a length direction of the capillary pattern that contacts and is supported by the surface of the semiconductor chip, and a second portion in the length direction that is spaced apart from and unsupported by the surface of the semiconductor chip,
wherein a curvature of the second portion of each capillary pattern of the plurality of flexible capillary patterns changes according to temperature, and
wherein at least one capillary pattern of the plurality of flexible capillary patterns comprises a plurality of protrusions configured to prevent adhesion with the surface of the semiconductor chip.

2. The semiconductor device of claim 1, wherein each capillary pattern of the plurality of flexible capillary patterns further comprises a first layer having a first thermal expansion coefficient and a second layer having a second thermal expansion coefficient that is different from the first thermal expansion coefficient.

3. The semiconductor device of claim 1, wherein the second portion of each capillary pattern of the plurality of flexible capillary patterns has a roll shape.

4. The semiconductor device of claim 1, wherein the surface of the semiconductor chip on which the plurality of flexible capillary patterns are formed is an upper surface of the semiconductor chip.

5. The semiconductor device of claim 1, wherein each capillary pattern of the plurality of flexible capillary patterns comprises a first layer having a first thermal expansion coefficient and a second layer having a second thermal expansion coefficient that is less than the first thermal expansion coefficient, and
wherein the first layer is adjacent to the surface of the semiconductor chip, and the second layer is disposed on the first layer.

6. The semiconductor device of claim 1, wherein each capillary pattern of the plurality of flexible capillary patterns comprises a plurality of curved portions that are convex in a direction opposite to the surface of the semiconductor chip.

7. The semiconductor device of claim 6, wherein each curved portion of the plurality of curved portions extends in a width direction of the capillary pattern that is perpendicular to the length direction.

8. The semiconductor device of claim 1, wherein each capillary pattern of the plurality of flexible capillary patterns comprises a plurality of protrusions configured to prevent adhesion with the surface of the semiconductor chip.

9. The semiconductor device of claim 8, wherein the plurality of protrusions are on a surface of the capillary pattern facing the surface of the semiconductor chip.

10. The semiconductor device of claim 1, wherein each capillary pattern of the plurality of flexible capillary patterns comprises a surface roughness structure on a surface of the capillary pattern facing to the surface of the semiconductor chip.

11. The semiconductor device of claim 1, wherein the cooling channel comprises an immersed unit immersed from an upper surface of the semiconductor chip,
wherein the upper surface of the semiconductor chip comprises a bottom of the immersed unit, and
wherein the capillary pattern is on the bottom of the immersed unit.

12. The semiconductor device of claim 1, further comprising a housing surrounding the semiconductor chip,
wherein the cooling channel is in a space between the semiconductor chip and the housing.

13. A semiconductor device comprising:
a semiconductor chip comprising a semiconductor integrated circuit;
a cooling channel comprising a surface of the semiconductor chip and configured to provide a passage for a coolant to cool the semiconductor chip; and
a flexible capillary pattern formed on the surface of the semiconductor chip to move the coolant by capillary action,
wherein at least a portion of the flexible capillary pattern has a roll shape,
wherein the capillary pattern comprises a first layer having a first thermal expansion coefficient and a second layer having a second thermal expansion coefficient that different from the first thermal expansion coefficient and
wherein the flexible capillary pattern comprises an anti-distortion unit configured to prevent distortion of the flexible capillary pattern in a width direction of the flexible capillary pattern.

14. The semiconductor device of claim 13, wherein a curvature of the flexible capillary pattern changes with temperature.

15. The semiconductor device of claim 13, wherein the anti-distortion unit comprises a plurality of curved portions that are convex in a direction opposite to the surface of the semiconductor chip, and extend in the width direction of the capillary pattern.

16. The semiconductor device of claim 13, further comprising a plurality of protrusions formed on a surface of the flexible capillary pattern facing the surface of the semiconductor chip.

17. The semiconductor device of claim 13, wherein the flexible capillary pattern comprises a surface roughness structure formed on a surface of the capillary pattern facing the surface of the semiconductor chip.

18. The semiconductor device of claim 13, wherein the cooling channel comprises an immersed unit immersed from an upper surface of the semiconductor chip,
wherein the upper surface of the semiconductor chip comprises a bottom of the immersed unit, and
wherein the capillary pattern is on the bottom of the immersed unit.

19. The semiconductor device of claim 13, further comprising a housing surrounding the semiconductor chip,
wherein the cooling channel is in a space between the semiconductor chip and the housing.

* * * * *